(12) United States Patent
Kohda et al.

(10) Patent No.: US 7,792,171 B2
(45) Date of Patent: Sep. 7, 2010

(54) NITRIDE SEMICONDUCTOR LASER DEVICE

(75) Inventors: Shinichi Kohda, Kyoto (JP); Daisuke Nakagawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/269,363

(22) Filed: Nov. 12, 2008

(65) Prior Publication Data
US 2009/0141765 A1 Jun. 4, 2009

(30) Foreign Application Priority Data
Nov. 12, 2007 (JP) ............... 2007-293432

(51) Int. Cl.
*H01S 5/00* (2006.01)
(52) U.S. Cl. ............... 372/45.012; 372/43.01
(58) Field of Classification Search ........... 372/45.012
See application file for complete search history.

(56) References Cited

U.S. PATENT DOCUMENTS

| | | |
|---|---|---|
| 5,777,350 A | 7/1998 | Nakamura et al. |
| 6,631,149 B1 | 10/2003 | Tezen et al. |
| 7,606,278 B2 * | 10/2009 | Kuramoto ............... 372/45.01 |

* cited by examiner

Primary Examiner—Armando Rodriguez
(74) Attorney, Agent, or Firm—Rabin & Berdo, PC

(57) ABSTRACT

A nitride semiconductor laser device has a group III nitride semiconductor multilayer structure. The group III nitride semiconductor multilayer structure includes an n-type semiconductor layer, a p-type semiconductor layer and a light emitting layer held between the n-type semiconductor layer and the p-type semiconductor layer, and the p-type semiconductor layer is formed by successively stacking a p-side guide layer, a p-type electron blocking layer in contact with the p-side guide layer and a p-type cladding layer in contact with the p-type electron blocking layer from the side closer to the light emitting layer. The p-side guide layer is formed by stacking a layer made of a group III nitride semiconductor containing Al and a layer made of a group III nitride semiconductor containing no Al. The p-type cladding layer is made of a group III nitride semiconductor containing Al, and the p-type electron blocking layer is made of a group III nitride semiconductor having a larger Al composition than the p-type cladding layer.

16 Claims, 5 Drawing Sheets

NITRIDE SEMICONDUCTOR LASER DEVICE

BACKGROUND OF THE INVENTION

1. Field of the Invention

The present invention relates to a nitride semiconductor laser device including a nitride semiconductor multilayer structure made of group III nitride semiconductors.

2. Description of Related Art

Group III-V semiconductors employing nitrogen as a group V element are referred to as "group III nitride semiconductors", and typical examples thereof include aluminum nitride (AlN), gallium nitride (GaN) and indium nitride (InN), which can be generally expressed as $Al_xIn_yGa_{1-X-Y}N$ ($0 \leq X \leq 1$, $0 \leq Y \leq 1$ and $0 \leq X+Y \leq 1$).

A short wavelength laser source emitting a blue or green laser beam is increasingly employed in the fields of high-density recording in an optical disk represented by a DVD, image processing, medical instruments, measuring instruments and the like. Such a short wavelength laser source is constituted of a laser diode employing GaN semiconductors, for example.

A GaN semiconductor laser diode is manufactured by growing group III nitride semiconductors on a gallium nitride (GaN) substrate having a major surface defined by a c-plane by metal-organic vapor phase epitaxy (MOVPE). More specifically, an n-type cladding layer, an n-type guide layer, a light emitting layer (active layer), a p-type electron blocking layer, a p-type cladding layer and a p-type contact layer are grown on the GaN substrate by metal-organic vapor phase epitaxy, to form a semiconductor multilayer structure consisting of these semiconductor layers. For example, the n-type cladding layer is formed by a single AlGaN film, or has an AlGaN/GaN superlattice structure. The n-type guide layer is made of InGaN or GaN. The light emitting layer has a multiple quantum well structure including quantum well layers made of InGaN. The p-type electron blocking layer is made of AlGaN. The p-type cladding layer is formed by a single AlGaN film, or has an AlGaN/GaN superlattice structure. The p-type contact layer is made of AlInGaN.

According to this structure, the light emitting layer emits light by recombination of electrons and positive holes injected from the n-type layer and the p-type layer respectively. This light is confined between the n-type cladding layer and the p-type cladding layer, and is propagated in a direction orthogonal to the stacking direction of the semiconductor multilayer structure. Cavity end faces are formed on both ends in the propagation direction, so that the light is resonated/amplified while repeating induced emission between the pair of cavity end faces and part thereof is emitted from either cavity end face as the laser beam.

SUMMARY OF THE INVENTION

The p-type electron blocking layer is provided in order to reduce a threshold current density by preventing the electrons from overflowing and preventing nonradiative recombination. A large band gap is required for attaining this object, and hence the p-type electron blocking layer is constituted of an AlGaN layer having a large Al composition.

In consideration of the object of preventing the electrons from overflowing, it is effective to form the p-type electron blocking layer on a position close to the light emitting layer. On the other hand, p-type AlGaN has high resistance, and hence a large quantity of p-type dopant is required in order to reduce the resistance thereof. If a large quantity of dopant is present near the light emitting layer, however, emission loss is disadvantageously increased.

Therefore, a p-side guide layer made of InGaN or GaN may conceivably be interposed between the light emitting layer and the p-type electron blocking layer. Thus, a nitride semiconductor laser device having a low threshold current density can be implemented by suppressing emission loss.

According to this structure, however, the electron blocking layer made of AlGaN having a large Al composition is arranged adjacently to the p-type cladding layer made of AlGaN. The lattice constant of AlGaN is smaller than those of group III nitride semiconductors having other compositions, and an AlGaN crystal is so hard that the same applies large stress to a layer adjacent thereto. According to the aforementioned structure, therefore, remarkable stress is applied to the p-side guide layer from the p-type cladding layer and the p-type electron blocking layer made of AlGaN layer. This stress causes deterioration in an electricity test, to deteriorate the life characteristics of the GaN semiconductor laser diode.

An object of the present invention is to provide a nitride semiconductor laser device capable of improving life characteristics by relaxing stress resulting from an electron blocking layer while reducing a threshold current density by arranging the electron blocking layer containing Al between a p-side guide layer and a p-type cladding layer.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
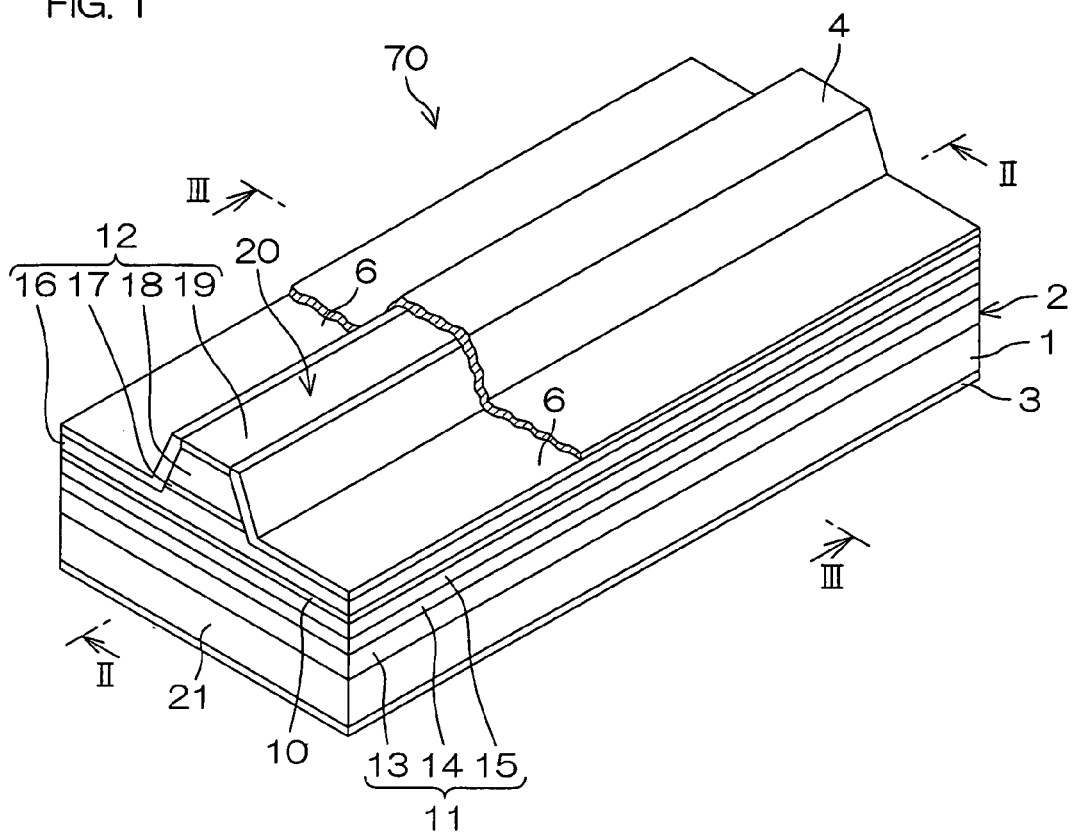
FIG. 1 is a perspective view for illustrating the structure of a semiconductor laser diode according to an embodiment of the present invention.

A nitride semiconductor laser device according to an embodiment of the present invention has a group III nitride semiconductor multilayer structure. This group III nitride semiconductor multilayer structure includes an n-type semiconductor layer, a p-type semiconductor layer and a light emitting layer held between the n-type semiconductor layer and the p-type semiconductor layer, and the p-type semiconductor layer is formed by successively stacking a p-side guide layer, a p-type electron blocking layer in contact with the p-side guide layer and a p-type cladding layer in contact with the p-type electron blocking layer from the side closer to the light emitting layer. The p-side guide layer is formed by stacking a layer made of a group III nitride semiconductor containing Al and a layer made of a group III nitride semiconductor containing no Al. The p-type cladding layer is made of a group III nitride semiconductor containing Al, and the p-type electron blocking layer is made of a group III nitride semiconductor having a larger Al composition than the p-type cladding layer.

According to this structure, the p-type electron blocking layer having the Al composition larger than that of the p-type cladding layer is formed in contact with the p-type cladding layer containing Al. The p-side guide layer is formed between the p-type electron blocking layer and the light emitting layer. This p-side guide layer is formed by stacking the layer made of the group III nitride semiconductor containing Al and the layer made of the group III nitride semiconductor containing no Al. According to this structure, the p-side guide layer relaxes stress resulting from the p-type electron blocking layer.

Thus, the stress resulting from the p-type electron blocking layer can be absorbed by the p-side guide layer while distancing the p-type electron blocking layer containing Al from the light emitting layer thereby suppressing emission loss and reducing the threshold current density, whereby the life characteristics of the device can be improved.

Preferably, the thickness of the p-side guide layer is 50 nm to 200 nm (more preferably, about 100 nm).

Preferably, the p-side guide layer has a superlattice structure obtained by alternately stacking a layer made of a group III nitride semiconductor containing Al and a layer made of a group III nitride semiconductor containing no Al which form a plurality of pairs of the layers. According to this structure, the stress resulting from the p-type electron blocking layer can be more effectively relaxed due to the superlattice structure of the p-side guide layer.

Preferably, the superlattice structure of the p-side guide layer has not less than five pairs of alternately stacked layers, each pair including a layer made of the group III nitride semiconductor containing Al and a layer made of the group III nitride semiconductor containing no Al.

Preferably, the p-type cladding layer is formed by stacking a layer made of a group III nitride semiconductor containing Al and a layer made of a group III nitride semiconductor containing no Al. According to this structure, the stress resulting from the p-type electron blocking layer can be further relaxed as compared with a case of forming the p-type cladding layer by a single group III nitride semiconductor layer containing Al.

Preferably, the p-type cladding layer has a superlattice structure obtained by alternately stacking a plurality of layers made of a group III nitride semiconductor containing Al and layers made of a group III nitride semiconductor containing no Al which form a plurality of pairs of the layers. According to this structure, the stress resulting from the p-type electron blocking layer can be more effectively relaxed due to the superlattice structure of the p-type cladding layer.

Preferably, the superlattice structure of the p-type cladding layer is obtained by stacking not less than five pairs of the alternately stacked layers, each pair including the layer made of the group III nitride semiconductor containing Al and the layer made of the group III nitride semiconductor containing no Al.

The embodiment of the present invention is now described in more detail with reference to the attached drawings.

Figure 2:
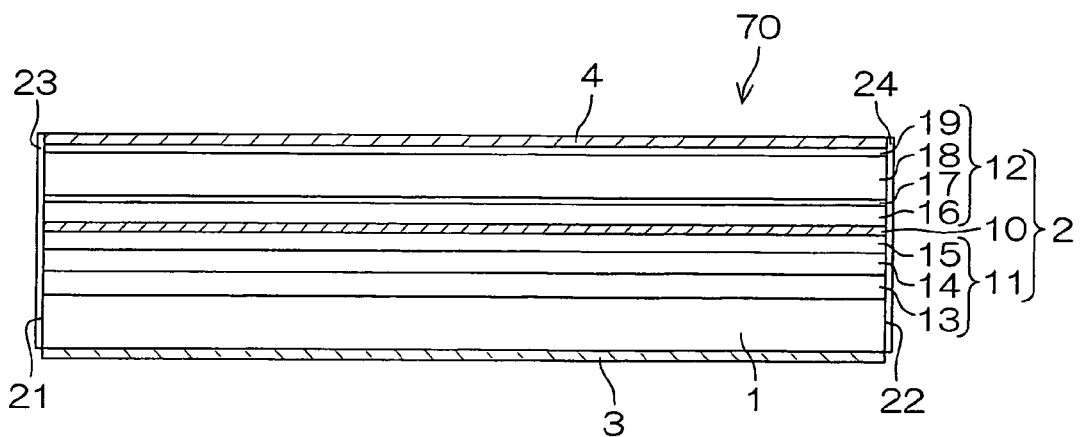
FIG. 2 is a longitudinal sectional view taken along a line II-II in FIG. 1.
Figure 3:
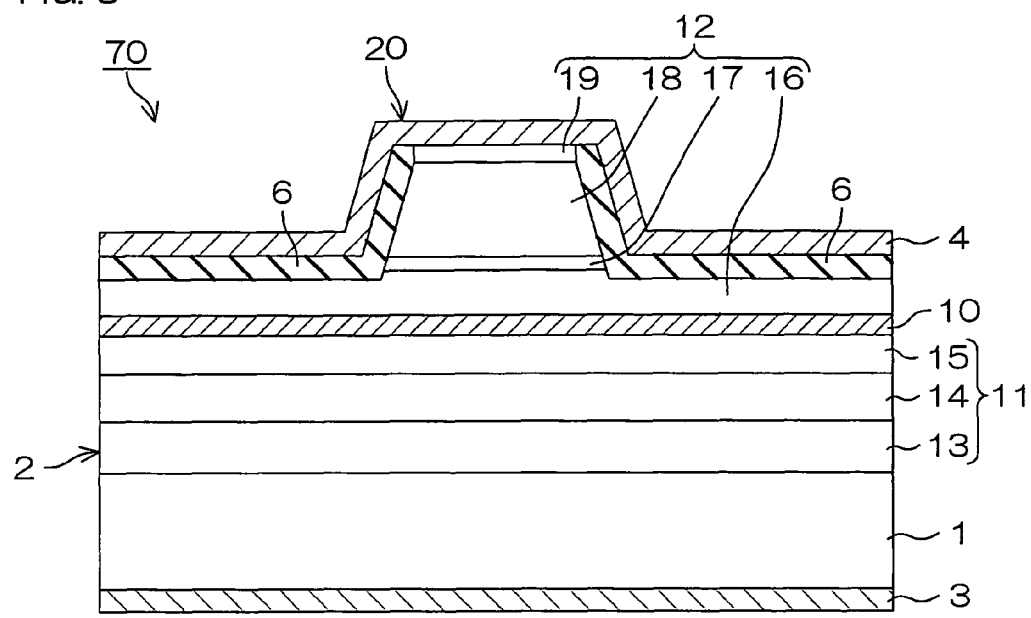
FIG. 3 is a cross sectional view taken along a line III-III in FIG. 1.

FIG. 1 is a perspective view for illustrating the structure of a nitride semiconductor laser diode according to the embodiment of the present invention, FIG. 2 is a longitudinal sectional view taken along a line II-II in FIG. 1, and FIG. 3 is a cross sectional view taken along a line III-III in FIG. 1.

This semiconductor laser diode 70 is a Fabry-Perot laser diode including a substrate 1, a group III nitride semiconductor multilayer structure 2 formed on the substrate 1 by crystal growth, an n-type electrode 3 formed to be in contact with a back surface (a surface opposite to the group III nitride semiconductor multilayer structure 2) of the substrate 1 and a p-type electrode 4 formed to be in contact with the surface of the group III nitride semiconductor multilayer structure 2.

According to this embodiment, the substrate 1 is formed by a GaN monocrystalline substrate. The substrate 1 has a major surface defined by a c-plane or an m-plane, for example, and the group III nitride semiconductor multilayer structure 2 is formed by crystal growth on this major surface. The group III nitride semiconductor multilayer structure 2 is made of group III nitride semiconductors having major growth surfaces of the same crystal plane as the substrate 1.

The group III nitride semiconductor multilayer structure 2 includes a light emitting layer 10, an n-type semiconductor layered portion 11 and a p-type semiconductor layered portion 12. The n-type semiconductor layered portion 11 is disposed on a side of the light emitting layer 10 closer to the substrate 1, while the p-type semiconductor layered portion 12 is disposed on a side of the light emitting layer 10 closer to the p-type electrode 4. Thus, the light emitting layer 10 is held between the n-type semiconductor layered portion 11 and the p-type semiconductor layered portion 12, whereby a double heterojunction structure is provided. Electrons and positive holes are injected into the light emitting layer 10 from the n-type semiconductor layered portion 11 and the p-type semiconductor layered portion 12 respectively. The electrons and the positive holes are recombined in the light emitting layer 10, to emit light.

The n-type semiconductor layered portion 11 is formed by successively stacking an n-type GaN contact layer 13 (having a thickness of about 2 µm, for example), an n-type AlGaN cladding layer 14 (having a thickness of not more than 1.5 µm such as a thickness of 1.0 µm, for example) and an n-type GaN guide layer 15 (having a thickness of 0.1 µm, for example) from the side closer to the substrate 1.

On the other hand, the p-type semiconductor layered portion 12 is formed by successively stacking a p-side guide layer 16 (having a thickness of 0.1 µm, for example), a p-type AlGaN electron blocking layer 17 (having a thickness of 20 nm, for example), a p-type AlGaN cladding layer 18 (having a thickness of not more than 1.5 µm such as a thickness of 0.4 µm, for example) and a p-type GaN contact layer 19 (having a thickness of 0.3 µm, for example) on the light emitting layer 10.

The n-type GaN contact layer 13 is a low-resistance layer. The p-type GaN contact layer 19 is a low-resistance layer for attaining ohmic contact with the p-type electrode 4. The n-type GaN contact layer 13 is made of an n-type semiconductor prepared by doping GaN with Si, for example, serving as an n-type dopant in a high doping concentration ($3 \times 10^{18}$ $cm^{-3}$, for example). The p-type GaN contact layer 19 is made of a p-type semiconductor prepared by doping GaN with Mg serving as a p-type dopant in a high doping concentration ($3 \times 10^{19}$ $cm^{-3}$, for example).

The n-type AlGaN cladding layer 14 and the p-type AlGaN cladding layer 18 provide a light confining effect confining the light emitted by the light emitting layer 10 therebetween. The n-type AlGaN cladding layer 14 is made of an n-type semiconductor prepared by doping AlGaN with Si, for example, serving as an n-type dopant (in a doping concentration of $1\times10^{18}$ cm$^{-3}$, for example). The p-type AlGaN cladding layer 18 is made of a p-type semiconductor prepared by doping AlGaN with Mg serving as a p-type dopant (in a doping concentration of $1\times10^{19}$ cm$^{-3}$, for example). The n-type AlGaN cladding layer 14 has a larger band gap than the n-type GaN guide layer 15, and the p-type AlGaN cladding layer 18 has a larger band gap than the p-side guide layer 16. Thus, the light can be excellently confined, to provide the semiconductor laser diode with a low threshold and a high efficiency.

The n-type GaN guide layer 15 and the p-side guide layer 16 are semiconductor layers providing a carrier confining effect for confining carriers (electrons and positive holes) in the light emitting layer 10. Thus, the efficiency of recombination of the electrons and the positive holes is improved in the light emitting layer 10. The n-type GaN guide layer 15 is made of an n-type semiconductor prepared by doping GaN with Si, for example, serving as an n-type dopant (in a doping concentration of $1\times10^{18}$ cm$^{-3}$, for example).

Figure 4:
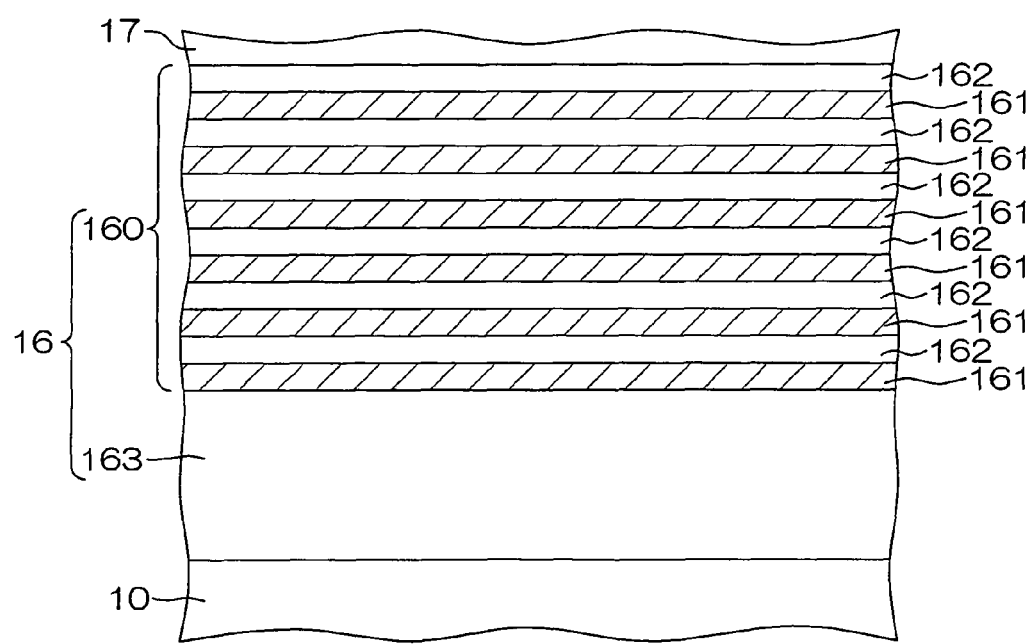
FIG. 4 is a partially enlarged sectional view for illustrating the structure of a p-side guide layer.

The p-side guide layer 16 has a superlattice structure 160 shown in FIG. 4. More specifically, the superlattice structure 160 is formed by repetitively stacking a plurality of pairs (preferably not less than five pairs: six pairs in FIG. 4) of p-type AlGaN layers 161 (shown with slanting lines) and p-type GaN layers 162 that are alternately stacked. Each p-type AlGaN layer 161 is made of a p-type semiconductor prepared by doping AlGaN with Mg serving as a p-type dopant (in a doping concentration of $5\times10^{18}$ cm$^{-3}$, for example). Each p-type GaN layer 162 is made of a p-type semiconductor prepared by doping GaN similarly with Mg serving as a p-type dopant. The thickness of each p-type AlGaN layer 161 is set to 5 nm, for example, and the Al composition thereof is set to about 2%, for example. The thickness of each p-type GaN layer 162 is set to 5 nm, for example. A p-type GaN layer 163 having a thickness (50 nm, for example) larger than that of each p-type GaN layer 161 is formed on a side of the superlattice structure 160 closer to the light emitting layer 10, to partially constitute the p-side guide layer 16. The p-type GaN layer 163 is made of a p-type semiconductor prepared by doping GaN with Mg serving as a p-type dopant (in a doping concentration of $5\times10^{18}$ cm$^{-3}$, for example).

The p-type AlGaN electron blocking layer 17 is made of a p-type semiconductor prepared by doping AlGaN with Mg, for example, serving as a p-type dopant (in a doping concentration of $5\times10^{18}$ cm$^{-3}$, for example). The p-type AlGaN electron blocking layer 17 improves the efficiency of recombination of the electrons and the positive holes by preventing the electrons from flowing out of the light emitting layer 10. The p-type AlGaN electron blocking layer 17 has an Al composition (of 15%, for example) larger than that of the p-type AlGaN cladding layer 18, in order to increase the band gap.

The p-type dopant concentration in the p-side guide layer 16 can be reduced lower than that of the p-type AlGaN electron blocking layer 17. For example, both of the concentrations of the p-type dopant in the superlattice structure 160 and the p-type GaN layer 163 may be set to $1\times10^{18}$ cm$^{-3}$, for example. Alternatively, both of the superlattice structure 160 and the GaN layer 163 may be non-doped. Further alternatively, the concentration of the p-type dopant in the superlattice structure 160 may be set to $1\times10^{18}$ cm$^{-3}$, for example, and the GaN layer 163 may be non-doped. In this case, only the superlattice structure 160 is made of p-type semiconductors in the p-side guide layer 16. Therefore, the superlattice structure 160 can also exhibit an electron blocking effect to some extent, whereby luminous efficiency can responsively be improved.

The light emitting layer 10, having an MQW (multiple-quantum well) structure, is a layer for emitting light by recombination of the electrons and the positive holes and amplifying the emitted light. More specifically, the light emitting layer 10 is formed by alternately repetitively stacking InGaN sublayers (each having a thickness of 3 nm, for example) as quantum well layers and GaN sublayers (each having a thickness of 9 nm, for example) as barrier layers by a plurality of cycles. The InGaN layers and the GaN layers are alternately repetitively stacked by two to seven cycles, for example, to constitute the light emitting layer 10 having the MQW structure. The emission wavelength is set to 400 nm to 550 nm. This emission wavelength can be adjusted by adjusting the In composition in the InGaN layers. The barrier layers may be formed by InGaN layers having a smaller In composition than the quantum well layers, in place of the GaN layers.

The p-type semiconductor layer 12 is partially removed, to form a ridge stripe 20. More specifically, the p-type contact layer 19, the p-type AlGaN cladding layer 18, the p-type AlGaN electron blocking layer 17 and the p-side guide layer 16 are partially removed by etching, to form the ridge stripe 20 having a generally trapezoidal (mesa) shape in cross sectional view. More specifically, these layers are partially removed by etching up to an intermediate portion of the superlattice structure 160 in the thickness direction. This ridge stripe 20 is formed along the m-axis direction when the major surface of the substrate 1 is defined by the c-plane, and formed along the c-axis direction when the major surface of the substrate 1 is defined by the m-plane. The lower edge of the ridge stripe 20 is so positioned in the superlattice structure 160 that stress can be relaxed on the lower edge of the ridge stripe 20.

The group III nitride semiconductor multilayer structure 2 has a pair of end faces 21 and 22 (cleavage planes) formed by cleaving both longitudinal ends of the ridge stripe 20. The pair of end faces 21 and 22 are parallel to each other, and both of the end faces 21 and 22 are perpendicular to the longitudinal direction of the ridge stripe 20. Thus, the n-type GaN guide layer 15, the light emitting layer 10 and the p-side guide layer 16 constitute a Fabry-Perot cavity along the c-axis direction with the end faces 21 and 22 serving as the cavity end faces. In other words, the light emitted in the light emitting layer 10 reciprocates between the cavity end faces 21 and 22, and is amplified by induced emission. Part of the amplified light is extracted from one of the cavity end faces 21 and 22 as the laser beam.

The n-type electrode 3 made of Al metal, for example, and the p-type electrode 4 made of Al metal or a Pd/Au alloy, for example, are in ohmic contact with the p-type contact layer 19 and the substrate 1 respectively. Insulating layers 6 covering the exposed surfaces of the p-side guide layer 16, the p-type AlGaN electron blocking layer 17 and the p-type AlGaN cladding layer 18 are provided such that the p-type electrode 4 is in contact with only the p-type GaN contact layer 19 provided on the top face (striped contact region) of the ridge stripe 20. Thus, a current can be concentrated on the ridge stripe 20, thereby enabling efficient laser oscillation. The regions of the surface of the ridge stripe 20 excluding the portion in contact with the p-type electrode 4 are covered with and protected by the insulating layers 6, whereby lateral light confining can be softened and easily controlled, and leakage currents from the side surfaces can be prevented. The insulating layers 6 can be made of an insulating material such as $SiO_2$ or $ZrO_2$, for example, having a refractive index greater than 1.

When the major surface of the substrate 1 is defined by the m-plane, the top face of the ridge stripe 20 is defined by an m-plane, and the p-type electrode 4 is formed on this m-plane. The back surface of the substrate 1 provided with the n-type electrode 3 is also defined by an m-plane. Thus, when both of the p- and n-type electrodes 4 and 3 are formed on m-planes, the laser output can be increased and reliability with respect to a high-temperature operation can be improved.

The cavity end faces 21 and 22 are covered with insulating films 23 and 24 (not shown in FIG. 1) respectively.

Figure 5:
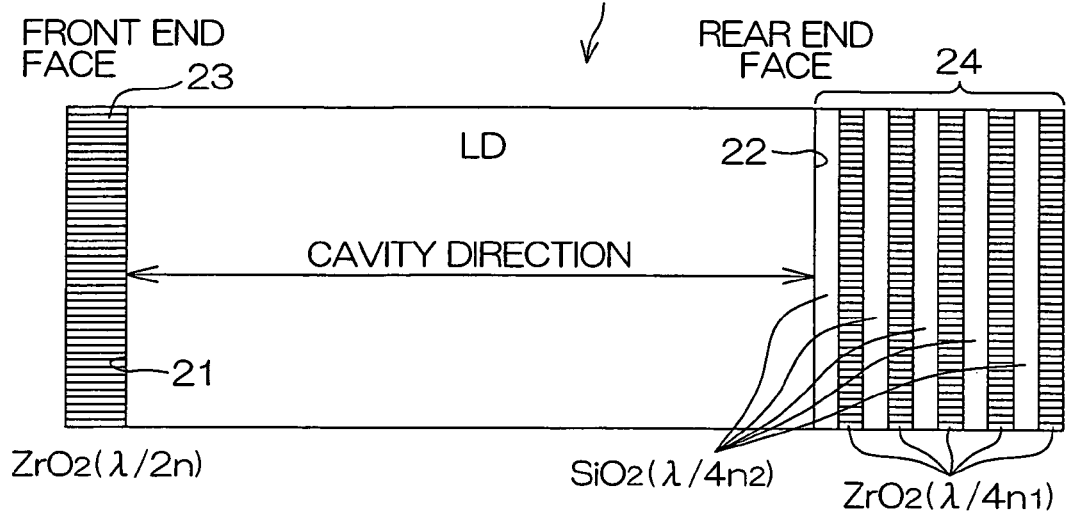
FIG. 5 is a schematic diagram for illustrating the structures of insulating films (reflecting films) formed on cavity end faces.

As schematically shown in FIG. 5, the insulating film 23 formed to cover the emitting-side cavity end face 21 is constituted of a single film of $ZrO_2$, for example. On the other hand, the insulating film 24 formed on the opposite cavity end face 22 is constituted of a multiple reflecting film formed by alternately repetitively stacking $SiO_2$ films and $ZrO_2$ films a plurality of times (five times in the example shown in FIG. 4), for example. The thickness of the single $ZrO_2$ film constituting the insulating film 23 is set to $\lambda/2n_1$ (where $\lambda$ represents the emission wavelength of the light emitting layer 10 and $n_1$ represents the refractive index of $ZrO_2$). On the other hand, the multiple reflecting film constituting the insulating film 24 is formed by alternately stacking the $SiO_2$ films each having a thickness of $\lambda/4n_2$ (where $n_2$ represents the refractive index of $SiO_2$) and the $ZrO_2$ films each having a thickness of $\lambda/4n_1$.

According to this structure, the cavity end face 21 has small reflectivity, while the cavity end face 22 has large reflectivity. More specifically, the reflectivity of the cavity end face 21 is about 20%, while the reflectivity of the cavity end face 22 is about 99.5% (generally 100%). Therefore, the cavity end face 21 emits a larger quantity of laser output. In other words, the cavity end face 21 serves as a laser emitting end face in this semiconductor laser diode 70.

According to this structure, light having the wavelength of 400 nm to 550 nm can be emitted by connecting the n-type electrode 3 and the p-type electrode 4 to a power source and injecting the electrons and the positive holes into the light emitting layer 10 from the n-type semiconductor layered portion 11 and the p-type semiconductor layered portion 12 respectively thereby recombining the electrons and the positive holes in the light emitting layer 10. This light reciprocates between the cavity end faces 21 and 22 along the guide layers 15 and 16, and is amplified by induced emission. Thus, a larger quantity of laser output is extracted from the cavity end face 21 serving as the laser emitting end face.

For example, the GaN monocrystalline substrate having the major surface defined by the m-plane can be cut from a GaN monocrystalline having a major surface defined by a c-plane. The m-plane of the cut substrate is polished by chemical mechanical polishing, for example, so that azimuth errors related to both of the (0001) and (11-20) directions are within ±1° (preferably within ±0.3°). Thus, the GaN monocrystalline substrate having the major surface defined by the m-plane is obtained with no dislocations and crystal defects such as stacking faults. Only steps of the atomic level are formed on the surface of this GaN monocrystalline substrate.

The group III nitride semiconductor multilayer structure 2 constituting a semiconductor laser diode structure is grown on the GaN monocrystalline substrate obtained in this manner by metal-organic vapor phase deposition.

When the group III nitride semiconductor multilayer structure 2 having a major growth surface defined by an m-plane is grown on the GaN monocrystalline substrate 1 having the major surface defined by the m-plane and a section along an a-plane is observed with an electron microscope (STEM: scanning transmission electron microscope), no striations showing presence of dislocations are observed on the group III nitride semiconductor multilayer structure 2. When the surface state thereof is observed with an optical microscope, it is understood that planarity in the c-axis direction (difference between the heights of rearmost and lowermost portions) is within 10 Å. This indicates that the planarity of the light emitting layer 10, particularly the quantum well layers, in the c-axis direction is within 10 Å, and the half width of the emission spectrum can be reduced.

Thus, dislocation-free m-plane group III nitride semiconductors having planar stacking interfaces can be grown on the GaN monocrystalline substrate 1. However, the offset angle of the major surface of the GaN monocrystalline substrate 1 is preferably set within ±1° (more preferably, within ±0.3°). If GaN semiconductor layers are grown on an m-plane GaN monocrystalline substrate having an offset angle of 2°, for example, GaN crystals may be grown in such a terraced manner that no planar surface state can be obtained dissimilarly to the case of setting the offset angle within ±1°.

Figure 6:
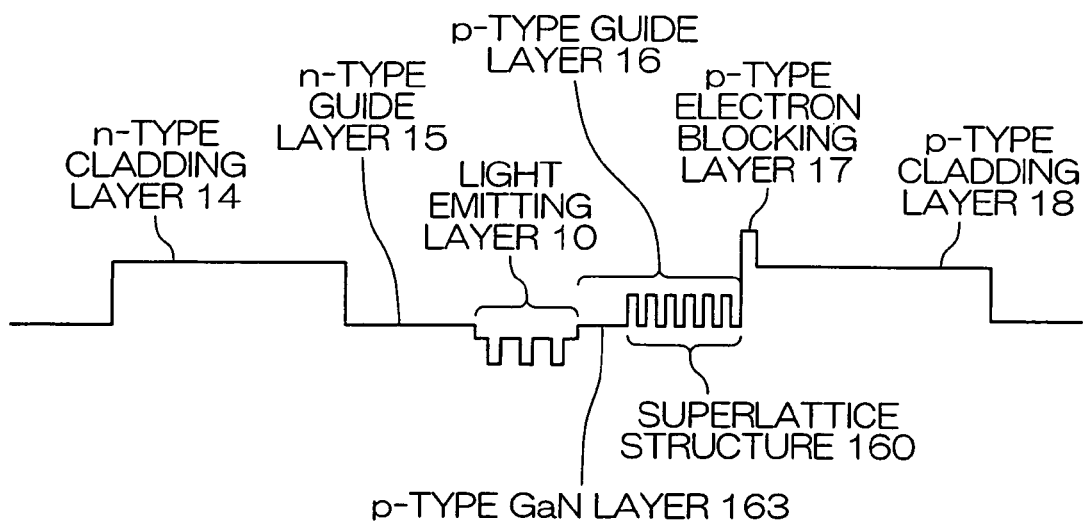
FIG. 6 is an energy band diagram for illustrating energy gaps of layers constituting a group III nitride semiconductor multilayer structure.

FIG. 6 is an energy band diagram for illustrating energy gaps of the layers constituting the group III nitride semiconductor multilayer structure 2. The p-type AlGaN electron blocking layer 17 having a large Al composition exhibits the largest energy gap, while the n- and p-type cladding layers 14 and 18 exhibit the second-largest energy gap. The light emitting layer 10 has the structure obtained by alternately stacking the quantum well layers having a small energy gap and the barrier layers having a relatively large energy gap. The n-type GaN guide layer 15 constituted of a single GaN film is arranged between the light emitting layer 10 and the n-type cladding layer 14.

On the other hand, the p-side guide layer 16 is interposed between the light emitting layer 10 and the p-type AlGaN electron blocking layer 17. This p-side guide layer 16 is formed by alternately stacking the GaN layers 162 and 163 having a relatively small band gap and the AlGaN layers 162 having a relatively large band gap, as hereinabove described.

Thus, the p-side guide layer 16 is interposed between the p-type AlGaN electron blocking layer 17 having a large Al composition and the light emitting layer 10 in the semiconductor laser diode 70 according to this embodiment. Thus, emission loss resulting from the p-type dopant (Mg) contained in the p-type AlGaN electron blocking layer 17 in a high concentration can be suppressed, thereby reducing the threshold current density. The p-side guide layer 16 may have a low Mg concentration, despite the p-type AlGaN layers 161, doped with Mg, included therein. This is because the p-type AlGaN layers 161 constitute the superlattice structure 160 along with the p-type GaN layers 162 and the Al composition thereof may not be increased dissimilarly to the AlGaN electron blocking layer 17, and hence necessary conductivity is obtained with a low Mg doping concentration.

According to this embodiment, further, the p-type GaN layer 163 is in contact with the light emitting layer 10. The p-type GaN layer 163 may not have a high Mg concentration, and hence the emission loss can be suppressed. In addition, the p-type GaN layer 163 improves the functions of core layers (the light emitting layer 10 and the guide layers 15 and 16) guiding the light inside the cladding layer 18. In other words, the superlattice structure 160 formed by alternately stacking the AlGaN layers and the GaN layers has a lower refractive index than a single GaN film. On the other hand, the p-type GaN layer 163 arranged inside the superlattice structure 160 has a sufficiently high refractive index. Thus, the p-side guide layer 16 has a sufficient refractive index as a whole, and hence the light can be concentrated on the core layers.

On the other hand, the p-side guide layer 16 including the superlattice structure 160 relaxes stress resulting from the p-type AlGaN electron blocking layer 17, having a large Al composition, arranged adjacently to the p-type AlGaN cladding layer 18. Thus, deterioration in energization can be so suppressed as to improve the life characteristics of the semiconductor laser diode 70.

Figure 7:
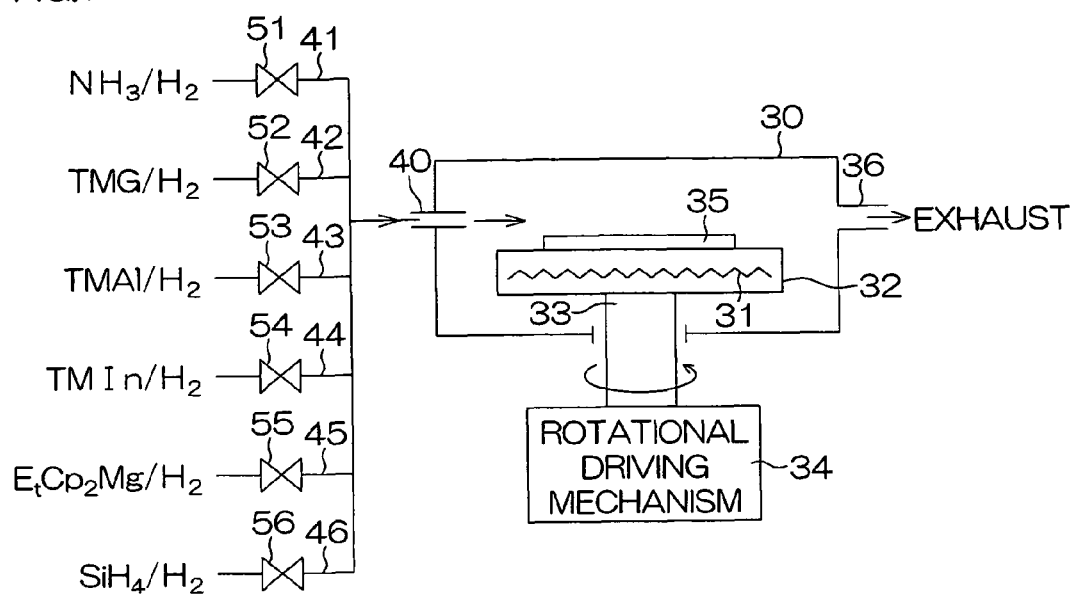
FIG. 7 is a schematic diagram for illustrating the structure of a treating apparatus for growing the layers constituting the group III nitride semiconductor multilayer structure.

FIG. 7 is a schematic diagram for illustrating the structure of a treating apparatus for growing the layers constituting the group III nitride semiconductor multilayer structure 2. A susceptor 32 storing a heater 31 is arranged in a treating chamber 30. The susceptor 32 is coupled to a rotating shaft 33, which is rotated by a rotational driving mechanism 34 arranged outside the treating chamber 30. Thus, the susceptor 32 so holds a wafer 35 to be treated that the wafer 35 can be heated to a prescribed temperature and rotated in the treating chamber 30. The wafer 35 is a GaN monocrystalline wafer constituting the aforementioned GaN monocrystalline substrate 1.

An exhaust pipe 36 is connected to the treating chamber 30. The exhaust pipe 36 is connected to an exhaust unit such as a rotary pump. Thus, the treating chamber 30 is set to 1/10 atm. to ordinary pressure, and regularly exhausted.

On the other hand, a source gas feed passage 40 for feeding source gas toward the surface of the wafer 35 held by the susceptor 32 is introduced into the treating chamber 30. A nitrogen material pipe 41 feeding ammonia as nitrogen source gas, a gallium material pipe 42 feeding trimethyl gallium (TMG) as gallium source gas, an aluminum material pipe 43 feeding trimethyl aluminum (TMAl) as aluminum source gas, an indium material pipe 44 feeding trimethyl indium (TMIn) as indium source gas, a magnesium material pipe 45 feeding ethylcyclopentadienyl magnesium (EtCp$_2$Mg) as magnesium source gas and silicon material pipe 46 feeding silane (SiH$_4$) as silicon source gas are connected to the treating chamber 30. Valves 51 to 56 are interposed in these material pipes 41 to 46 respectively. Each source gas is fed along with carrier gas consisting of hydrogen and/or nitrogen.

The GaN monocrystalline wafer having a major surface defined by a c-plane or an m-plane is held on the susceptor 32 as the wafer 35, for example. In this state, the nitrogen material valve 51 is opened while the valves 52 to 56 are kept closed, for feeding the carrier gas and ammonia gas (nitrogen source gas) into the treating chamber 30. Further, the heater 31 is so electrified as to heat the wafer 35 to a temperature of 1000° C. to 1100° C. (1050° C., for example). Thus, GaN semiconductors can be grown without roughening the surface of the wafer 35.

After the wafer temperature reaches 1000° C. to 1100° C., the nitrogen material valve 51, the gallium material valve 52 and the silicon material valve 56 are opened. Thus, ammonia, trimethyl gallium and silane are fed from the source gas feed passage 40 along with the carrier gas. Consequently, the n-type contact layer 13 made of GaN layer doped with silicon is grown on the surface of the wafer 35.

Then, the aluminum material valve 53 is opened, in addition to the nitrogen material valve 51, the gallium material valve 52 and the silicon material valve 56. Thus, ammonia, trimethyl gallium, silane and trimethyl aluminum are fed from the source gas feed passage 40 along with the carrier gas. Consequently, the n-type AlGaN cladding layer 14 is epitaxially grown on the n-type GaN contact layer 13.

Then, the aluminum material valve 53 is closed, while the nitrogen material valve 51, the gallium material valve 52 and the silicon material valve 56 are opened. Thus, ammonia, trimethyl gallium and silane are fed from the source gas feed passage 40 along with the carrier gas. Consequently, the n-type GaN guide layer 15 is epitaxially grown on the n-type AlGaN cladding layer 14.

Then, the silicon material valve 56 is closed, to grow the light emitting layer 10 (active layer) having the multiple quantum well structure. The light emitting layer 10 can be grown by alternately carrying out the steps of growing the InGaN layers (quantum well layers) by opening the nitrogen material valve 51, the gallium material valve 52 and the indium material valve 54 thereby feeding ammonia, trimethyl gallium and trimethyl indium to the wafer 35 and growing additive-free GaN layers (barrier layers) by closing the indium material valve 54 and opening the nitrogen material valve 51 and the gallium material valve 52 thereby feeding ammonia and trimethyl gallium to the wafer 35. For example, a GaN layer is formed at first, and an InGaN layer is formed thereon. These steps are repetitively carried out five times, for example. In the steps of forming the light emitting layer 10, the temperature of the wafer 35 is preferably set to 700° C. to 800° C. (730° C., for example), for example. At this time, the growth pressure is preferably set to not less than 700 torr, so that heat resistance can be improved.

When the barrier layers are constituted of InGaN having a smaller In composition than the quantum well layers, the flow rate of trimethyl indium for forming the barrier layers may be controlled to be smaller than that for forming the quantum well layers.

Then, the p-side guide layer 16 is formed. First, the indium material valve 54 is closed, while the nitrogen material valve 51, the gallium material valve 52 and the magnesium material valve 55 are opened. Thus, ammonia, trimethyl gallium and ethylcyclopentadienyl magnesium are fed toward the wafer 35, to form the p-type GaN layer 163 (see FIG. 4) doped with magnesium. Then, the p-type AlGaN layers 161 and the p-type GaN layers 162 are alternately repetitively formed a plurality of times, thereby forming the superlattice structure 160. The steps of forming the p-type AlGaN layers 161 can be carried out by opening the nitrogen material valve 51, the gallium material valve 52, the aluminum material valve 53 and the magnesium material valve 55 while closing the remaining valves 54 and 56 for feeding ammonia, trimethyl gallium, trimethyl aluminum and ethylcyclopentadienyl magnesium to the wafer 35. The steps of forming the p-type GaN layers 162 can be carried out by opening the nitrogen material valve 51, the gallium material valve 52 and the magnesium material valve 55 while closing the remaining valves 53, 54 and 56 for feeding ammonia, trimethyl gallium and ethylcyclopentadienyl magnesium to the wafer 35. In the step of forming the p-side guide layer 16, the temperature of the wafer 35 is preferably set to 900° C. to 1100° C. (1000° C., for example).

Then, the p-type electron blocking layer 17 is formed. In other words, the nitrogen material valve 51, the gallium material valve 52, the aluminum material valve 53 and the magnesium material valve 55 are opened, while the remaining valves 54 and 56 are closed. Thus, ammonia, trimethyl gallium, trimethyl aluminum and ethylcyclopentadienyl magnesium are fed toward the wafer 35, to form the p-type electron blocking layer 17 made of AlGaN doped with magnesium. In the step of forming the p-type electron blocking layer 17, the temperature of the wafer 35 is preferably set to 1000° C. to 1100° C. (1000° C., for example). The Al composition is controlled to 15%, for example, by adjusting the flow rate of the source gas.

Then, the nitrogen material valve 51, the gallium material valve 52, the aluminum material valve 53 and the magnesium material valve 55 are opened, while the remaining valves 54 and 56 are closed. Thus, ammonia, trimethyl gallium, trimethyl aluminum and ethylcyclopentadienyl magnesium are fed toward the wafer 35, to form the cladding layer 18 made of p-type AlGaN layer doped with magnesium. In the step of forming the p-type AlGaN cladding layer 18, the temperature of the wafer 35 is preferably set to 900° C. to 1100° C. (1000° C., for example). The Al composition is controlled to 5%, for example, by adjusting the flow rate of the source gas.

Then, the p-type contact layer 19 is formed. In other words, the nitrogen material valve 51, the gallium material valve 52 and the magnesium material valve 55 are opened, while the remaining valves 53, 54 and 56 are closed. Thus, ammonia, trimethyl gallium and ethylcyclopentadienyl magnesium are fed toward the wafer 35, to form the p-type contact layer 19 made of GaN layer doped with magnesium. In the step of forming the p-type GaN contact layer 19, the temperature of the wafer 35 is preferably set to 900° C. to 1100° C. (1000° C., for example).

The layers constituting the p-type semiconductor layer 12 are preferably crystal-grown at an average growth temperature of not more than 1000° C. Thus, heat damage to the light emitting layer 10 can be reduced.

When each of the layers 10 and 13 to 19 constituting the group III nitride semiconductor multilayer structure 2 is grown on the wafer 35 (GaN monocrystalline substrate 1), the ratio V/III of the molar fraction of the nitrogen material (ammonia) to the molar fraction of the gallium material (trimethyl gallium) fed to the wafer 35 in the treating chamber 30 is kept at a high level of not less than 1000 (preferably not less than 3000). More specifically, the average value of the ratio V/III is preferably not less than 1000 from the n-type cladding layer 14 up to the uppermost p-type contact layer 19. Thus, excellent crystals having small numbers of point defects can be obtained in all of the n-type cladding layer 14, the light emitting layer 10 and the p-type cladding layer 18.

According to this embodiment, the group III nitride semiconductor multilayer structure 2 having the major surface defined by the c-plane or the m-plane is grown in a dislocation-free and planar state at the aforementioned high ratio V/III, with no buffer layer interposed between the GaN monocrystalline substrate 1 and the group III nitride semiconductor multilayer structure 2. This group III nitride semiconductor multilayer structure 2 has neither stacking faults nor threading dislocations arising from the major surface of the GaN monocrystalline substrate 1.

Thus, the group III nitride semiconductor multilayer structure 2 is grown on the wafer 35, which in turn is transferred into an etching apparatus so that the ridge stripe 20 is formed by partially removing the p-type semiconductor layer 12 by dry etching such as plasma etching, for example. This ridge stripe 20 is so formed as to be parallel to the c-axis direction.

After the formation of the ridge stripe 20, the insulating layers 6 are formed. The insulating layers 6 are formed through a lift-off step, for example. In other words, the insulating layers 6 can be formed by forming a striped mask, thereafter forming a thin insulator film to entirely cover the exposed portions of the p-side guide layer 16, the p-type electron blocking layer 17, the p-type AlGaN cladding layer 18 and the p-type GaN contact layer 19 and thereafter lifting off the thin insulator film thereby exposing the p-type GaN contact layer 19.

Then, the p-type electrode 4 and the n-type electrode 3 are formed in ohmic contact with the p-type GaN contact layer 19 and the n-type GaN contact layer 13 respectively. These electrodes 3 and 4 can be formed by resistive heating or with a metal vapor deposition apparatus employing an electron beam, for example.

Then, the wafer 35 is divided into each individual device. In other words, each device constituting the semiconductor laser diode is cut by cleaving the wafer 35 in the directions perpendicular to and parallel to the ridge stripe 20 respectively. When the major surface of the substrate 1 is defined by the c-plane, for example, the wafer 35 is cleaved along the m-plane in relation to the direction perpendicular to the ridge stripe 20, and cleaved along the a-plane in relation to the direction parallel to the ridge stripe 20. When the major surface of the substrate 1 is defined by the m-plane, on the other hand, the wafer 35 is cleaved along the c-plane in relation to the direction perpendicular to the ridge stripe 20, and cleaved along the a-plane in relation to the direction parallel to the ridge stripe 20. Thus, the cavity end faces 21 and 22 are formed.

The aforementioned insulating films 23 and 24 are formed on the cavity end faces 21 and 22 respectively. These insulating films 23 and 24 can be formed by electron cyclotron resonance (ECR) film formation, for example. When a bar-shaped body is obtained by cleaving the wafer 35 in relation to the direction perpendicular to the ridge stripe 20 and the insulating films 23 and 24 are thereafter formed on a pair of side surfaces of the bar-shaped body, the insulating films 23 and 24 can be collectively formed on a plurality of laser devices. Thereafter the bar-shaped body may be cleaved along the direction parallel to the ridge stripe 20, to be divided into each individual chip.

Figure 8:
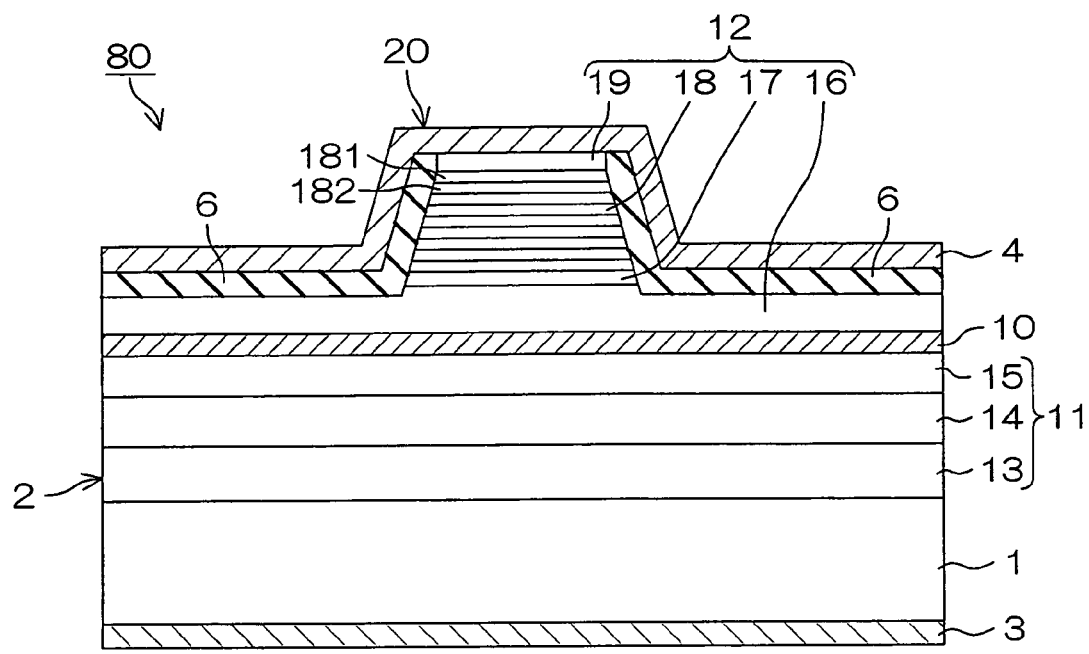
FIG. 8 is a cross sectional view for illustrating the structure of a semiconductor laser diode according to another embodiment of the present invention.

FIG. 8 is a cross sectional view for illustrating the structure of a semiconductor laser diode 80 according to another embodiment of the present invention. FIG. 8 shows a section (corresponding to FIG. 3) perpendicular to a cavity direction.

While the p-type cladding layer 18 is formed by a single AlGaN film in the aforementioned embodiment, a p-type cladding layer 18 has a superlattice structure obtained by alternately repetitively stacking p-type AlGaN layers 181 and p-type GaN layers 182 a plurality of times (five times, for example) in this embodiment. The thickness of each p-type AlGaN layer 181 is set to 10 nm, for example, while that of each p-type GaN layer 182 is also set to 10 nm, for example.

According to this structure, superlattice structures are arranged on both sides of a p-type AlGaN electron blocking layer 17 having a large Al composition. Consequently, stress resulting from the p-type AlGaN electron blocking layer 17 can be more effectively absorbed. Thus, the life characteristics of the device can be further improved.

While two embodiments of the present invention have been described, the present invention may be embodied in other ways.

For example, while the group III nitride semiconductor multilayer structure 2 having the major growth surface defined by the c-plane or the m-plane forms a laser structure in the aforementioned first embodiment, the laser structure may alternatively be formed by a group III nitride semiconductor multilayer structure having a major growth surface defined by still another crystal plane such as the a-plane.

While the p-side guide layer 16 has the superlattice structure 160 formed by alternately stacking the p-type AlGaN layers 161 and the p-type GaN layers 162 a plurality of times in the aforementioned first embodiment, the effect of relaxing the stress resulting from the p-type AlGaN electron blocking layer 17 can be attained also when the p-side guide layer 16 is formed by stacking a single p-type AlGaN layer and a single p-type GaN layer, for example. However, the p-side guide layer 16 having the superlattice structure 160 according to the aforementioned first embodiment can more effectively relax the stress, as a matter of course.

While the p-type cladding layer 18 has the superlattice structure formed by alternately stacking the p-type AlGaN layers 181 and the p-type GaN layers 182 a plurality of times in the aforementioned second embodiment, the effect of relaxing the stress resulting from the p-type AlGaN electron blocking layer 17 can be attained also when the p-type cladding layer 18 is formed by stacking a single p-type AlGaN layer and a single p-type GaN layer, for example. However, the p-type cladding layer 18 having the superlattice structure according to the aforementioned second embodiment can more effectively relax the stress, as a matter of course.

Further, the thicknesses and the impurity concentrations of the layers constituting the group III nitride semiconductor multilayer structure 2 described above are mere examples, and appropriate values can be properly selected therefor.

In addition, the substrate 1 may be removed by laser lift-off or the like after the formation of the group III nitride semiconductor multilayer structure 2, so that the semiconductor laser diode has no substrate 1.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-293432 filed in the Japanese Patent Office on Nov. 12, 2007, the entire disclosure of which is incorporated herein by reference.

What is claimed is:

1. A nitride semiconductor laser device having a group III nitride semiconductor multilayer structure, wherein
the group III nitride semiconductor multilayer structure includes an n-type semiconductor layer, a p-type semiconductor layer and a light emitting layer held between the n-type semiconductor layer and the p-type semiconductor layer,
the p-type semiconductor layer has a p-side guide layer, a p-type electron blocking layer in contact with the p-side guide layer and a p-type cladding layer in contact with the p-type electron blocking layer successively stacked from the side closer to the light emitting layer,
the p-type cladding layer is made of a group III nitride semiconductor containing Al,
the p-type electron blocking layer is made of a group III nitride semiconductor having a larger Al composition than that of the p-type cladding layer,
the p-side guide layer includes a superlattice structure having a plurality of pairs of alternately stacked layers, each pair including a layer made of a group III nitride semiconductor containing Al and a layer made of a group III nitride semiconductor containing no Al, and
the p-side guide layer further has a layer made of a group III nitride semiconductor containing no Al between the superlattice structure and the light emitting layer.

2. A nitride semiconductor laser device having a group III nitride semiconductor multilayer structure, wherein
the group III nitride semiconductor multilayer structure includes an n-type semiconductor layer, a p-type semiconductor layer and a light emitting layer held between the n-type semiconductor layer and the p-type semiconductor layer,
the p-type semiconductor layer has a p-side guide layer, a p-type electron blocking layer in contact with the p-side guide layer and a p-type cladding layer in contact with the p-type electron blocking layer successively stacked from the side closer to the light emitting layer,
the p-type cladding layer is made of a group III nitride semiconductor containing Al,
the p-type electron blocking layer is made of a group III nitride semiconductor having a larger Al composition than that of the p-type cladding layer,
the p-side guide layer includes a superlattice structure having a plurality of pairs of alternately stacked layers, each pair including a layer made of a group III nitride semiconductor containing Al and a layer made of a group III nitride semiconductor containing no Al, and
the superlattice structure is made of non-doped group III nitride semiconductors, and
the p-side guide layer further has a layer made of a p-type group III nitride semiconductor containing no Al between the superlattice structure and the light emitting layer.

3. The nitride semiconductor laser device according to claim 1, wherein
the alternately stacked layers in the p-side guide layer are p-type and a p-type dopant concentration of the p-side guide layer is lower than a p-type dopant concentration of the p-type electron blocking layer.

4. The nitride semiconductor laser device according to claim 1, wherein
the p-type cladding layer is formed by stacking a layer made of a group III nitride semiconductor containing Al and a layer made of a group III nitride semiconductor containing no Al.

5. The nitride semiconductor laser device according to claim 4, wherein
the p-type cladding layer includes a superlattice structure having a plurality of pairs of alternately stacked layers, each pair including a layer made of a group III nitride semiconductor containing Al and a layer made of a group III nitride semiconductor containing no Al.

6. The nitride semiconductor laser device according to claim 2, wherein
the alternately stacked layers in the p-side guide layer are p-type and a p-type dopant concentration of the p-side guide layer is lower than a p-type dopant concentration of the p-type electron blocking layer.

7. The nitride semiconductor laser device according to claim 2, wherein
the p-type cladding layer is formed by stacking a layer made of a group III nitride semiconductor containing Al and a layer made of a group III nitride semiconductor containing no Al.

8. The nitride semiconductor laser device according to claim 7, wherein
the p-type cladding layer includes a superlattice structure having a plurality of pairs of alternately stacked layers, each pair including a layer made of a group III nitride semiconductor containing Al and a layer made of a group III nitride semiconductor containing no Al.

9. The nitride semiconductor laser device according to claim 1, wherein
the layer between the superlattice structure and the light emitting layer includes a p-type GaN layer having a thickness larger than a thickness of the layer made of a group III nitride semiconductor containing no Al included in the superlattice structure.

10. The nitride semiconductor laser device according to claim 9, wherein
the alternately stacked layers in the p-side guide layer are p-type and a p-type dopant concentration of the p-side guide layer is lower than a p-type dopant concentration of the p-type electron blocking layer.

11. The nitride semiconductor laser device according to claim 9, wherein
the p-type cladding layer is formed by stacking a layer made of a group III nitride semiconductor containing Al and a layer made of a group III nitride semiconductor containing no Al.

12. The nitride semiconductor laser device according to claim 11, wherein
the p-type cladding layer includes a superlattice structure having a plurality of pairs of alternately stacked layers, each pair including a layer made of a group III nitride semiconductor containing Al and a layer made of a group III nitride semiconductor containing no Al.

13. The nitride semiconductor laser device according to claim 2, wherein
the layer between the superlattice structure and the light emitting layer includes a p-type GaN layer having a thickness larger than a thickness of the layer made of a group III nitride semiconductor containing no Al included in the superlattice structure.

14. The nitride semiconductor laser device according to claim 13, wherein
the alternately stacked layers in the p-side guide layer are p-type and a p-type dopant concentration of the p-side guide layer is lower than a p-type dopant concentration of the p-type electron blocking layer.

15. The nitride semiconductor laser device according to claim 13, wherein
the p-type cladding layer is formed by stacking a layer made of a group III nitride semiconductor containing Al and a layer made of a group III nitride semiconductor containing no Al.

16. The nitride semiconductor laser device according to claim 15, wherein
the p-type cladding layer includes a superlattice structure having a plurality of pairs of alternately stacked layers, each pair including a layer made of a group III nitride semiconductor containing Al and a layer made of a group III nitride semiconductor containing no Al.

* * * * *